United States Patent
Vierthaler et al.

(10) Patent No.: US 7,397,873 B2
(45) Date of Patent: *Jul. 8, 2008

(54) ADAPTIVE SIGNAL WEIGHTING SYSTEM

(75) Inventors: Matthias Vierthaler, Freiburg (DE); Carsten Noeske, Glottertal (DE)

(73) Assignee: Micronas GmbH, Freiburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/398,431

(22) Filed: Apr. 5, 2006

(65) Prior Publication Data

US 2006/0181640 A1     Aug. 17, 2006

Related U.S. Application Data

(63) Continuation of application No. 09/897,722, filed on Jul. 2, 2001, now Pat. No. 7,046,750.

(51) Int. Cl.
H04L 27/08     (2006.01)

(52) U.S. Cl. .................................. 375/345; 375/350

(58) Field of Classification Search ................. 375/345; 455/232.1, 234.1, 239.1, 240.1, 245.1, 249.1, 455/250.1

See application file for complete search history.

(56) References Cited

U.S. PATENT DOCUMENTS

| | | | |
|---|---|---|---|
| 4,101,849 A | 7/1978 | Blackmer et al. | 333/14 |
| 4,136,314 A | 1/1979 | Blackmer et al. | 328/167 |
| 4,539,526 A | 9/1985 | Davis | 330/144 |
| 6,118,879 A | 9/2000 | Hanna | 381/106 |

*Primary Examiner*—Kevin Kim
(74) *Attorney, Agent, or Firm*—O'Shea, Getz & Kosakowski, P.C.

(57) ABSTRACT

A system for decoding an electrical input signal includes a filter that impresses a variable gain on a portion of the input signal to deemphasize a spectral region of the input signal. The variable gain is set as a function of a variable gain control signal. A frequency detector generates the variable gain control signal in accordance with a frequency value wherein approximately one-half of the energy of the input signal is below the frequency value.

19 Claims, 5 Drawing Sheets

ADAPTIVE SIGNAL WEIGHTING SYSTEM

PRIORITY INFORMATION

This application is a continuation of Ser. No. 09/897,722 filed Jul. 2, 2001 now U.S. Pat. No. 7,046,750.

BACKGROUND OF THE INVENTION

This invention relates to signal conditioning systems, and in particular to a signal decoder with adaptive signal weighting.

Various techniques for encoding and decoding a data signal (e.g., video or audio) are known. For example, U.S. Pat. Nos. 4,101,849 and 4,136,314 disclose an encoding technique that compresses the data signal with high frequency preemphasis. The signal is then stored or transmitted onto or across a medium, and the received data signal is expanded and deemphasized in a complementary manner. Preemphasis involves altering the magnitude of select frequency components of the signal with respect to the magnitude of frequency components, to reduce noise and thus improve the signal-to-noise ratio (SNR). Similarly, deemphasis involves altering select frequency components of a received encoded signal (e.g., a signal that was transmitted across a communication channel or read from a storage medium), in either a negative or positive sense in a complementary manner to the preemphasis applied to the signal.

U.S. Pat. Nos. 4,101,849 and 4,136,314 disclose controlling the amount of preemphasis as a function of the ratio of the energy in high and low frequency portions of the data signal. Of course the amount of deemphasis is also controlled by the ratio of the energy in the high and low frequency portions of the signal. However, a problem with this ratio technique is that it does not the bandwidth of the transmission channel or the storage medium.

U.S. Pat. No. 4,539,526 discloses an adaptive signal weighting system for encoding and decoding a data signal. The technique disclosed therein preemphasizes only the high frequency signal components during encoding as a function of the spectral energy contained in the high frequency portion of the signal. On the decoder side the received signal is deemphasized in a complementary manner by providing a gain to the high frequency signal components based upon the spectral energy within the high frequency portion of the spectrum of the received signal. One problem with this technique is that it controls the amount of preemphasis/deemphasis based upon the spectrum of only the high frequency components.

Therefore, there is a need for an improved technique for encoding and/or decoding a data signal that is transmitted across a data channel or stored and retrieved from a storage medium.

SUMMARY OF THE INVENTION

Briefly, according to an aspect of the present invention, a system for decoding an electrical input signal includes a filter that impresses a variable gain on a portion of an input signal to deemphasize a spectral region of the input signal. The variable gain is set as a function of a variable gain control signal. A frequency detector generates the variable gain control signal in accordance with a frequency value wherein approximately one-half of the energy of the input signal is below the frequency value.

In one embodiment, the frequency detector includes a variable notch filter that receives and filters the input signal and provides a notch filtered signal value, wherein the notch filter includes a notch set as a function of the variable gain control signal. A mixer receives and mixes the notch indicative thereof to an integrator, which integrates the mixed signal to provide the variable gain control signal.

In a second embodiment, the frequency detector includes a low pass filter that filters the input signal to provide a first filtered signal. A first absolute value detector receives the first filtered signal and provides a first absolute filtered signal indicative thereof. An amplifier amplifies the first absolute value signal to provide an amplified first absolute filtered signal. A second absolute value detector receives the input signal and provides a second absolute filtered signal. A comparator compares the amplified first absolute filtered signal and the second absolute filtered signal that provides a control signal, which is indicative of the second control signal.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
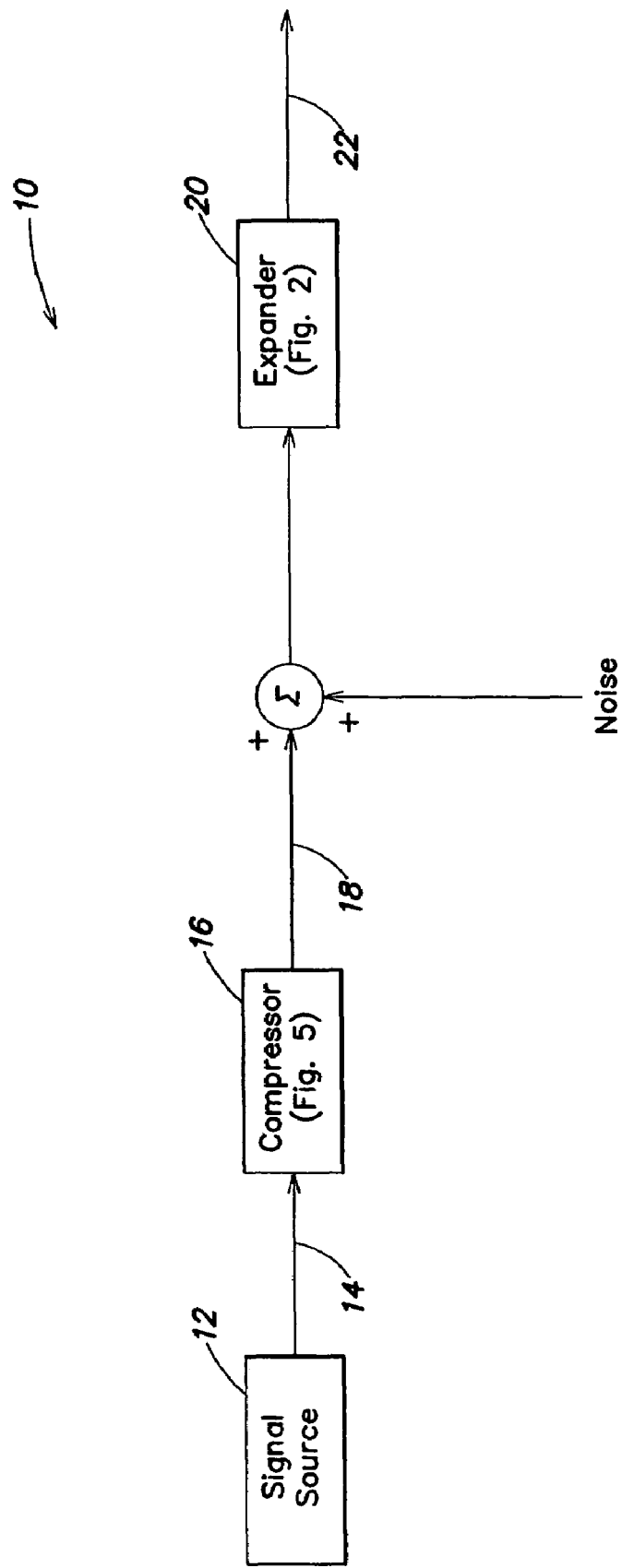
FIG. 1 is a block diagram illustration of a data communications system.

FIG. 1 is a block diagram illustration of a data communications system 10. The system includes a signal source 12 that provides a signal (e.g., audio and/or video) on a line 14 to a compressor 16 (i.e., an encoder), which provides a compressed (i.e., companded) signal on a line 18 that is transmitted over a communications channel (i.e., a communication medium or a storage media such as for example a tape, a CD, or an electronic memory device). The system also includes an expander 20 that receives the encoded/compressed signal from the communications medium or storage media, and decompresses the signal to provide a decompressed signal on a line 22. As known, transmitting a signal over a communications medium or writing a signal to a storage media often results in the coupling of some undesirable noise to the compressed signal on the line 18. The compressor 16 provides preemphasis to the high frequency portion of the input signal on the line 14, and the expander 20 provides a complementary deemphasis to the high frequency portion of its input signal.

Figure 2:
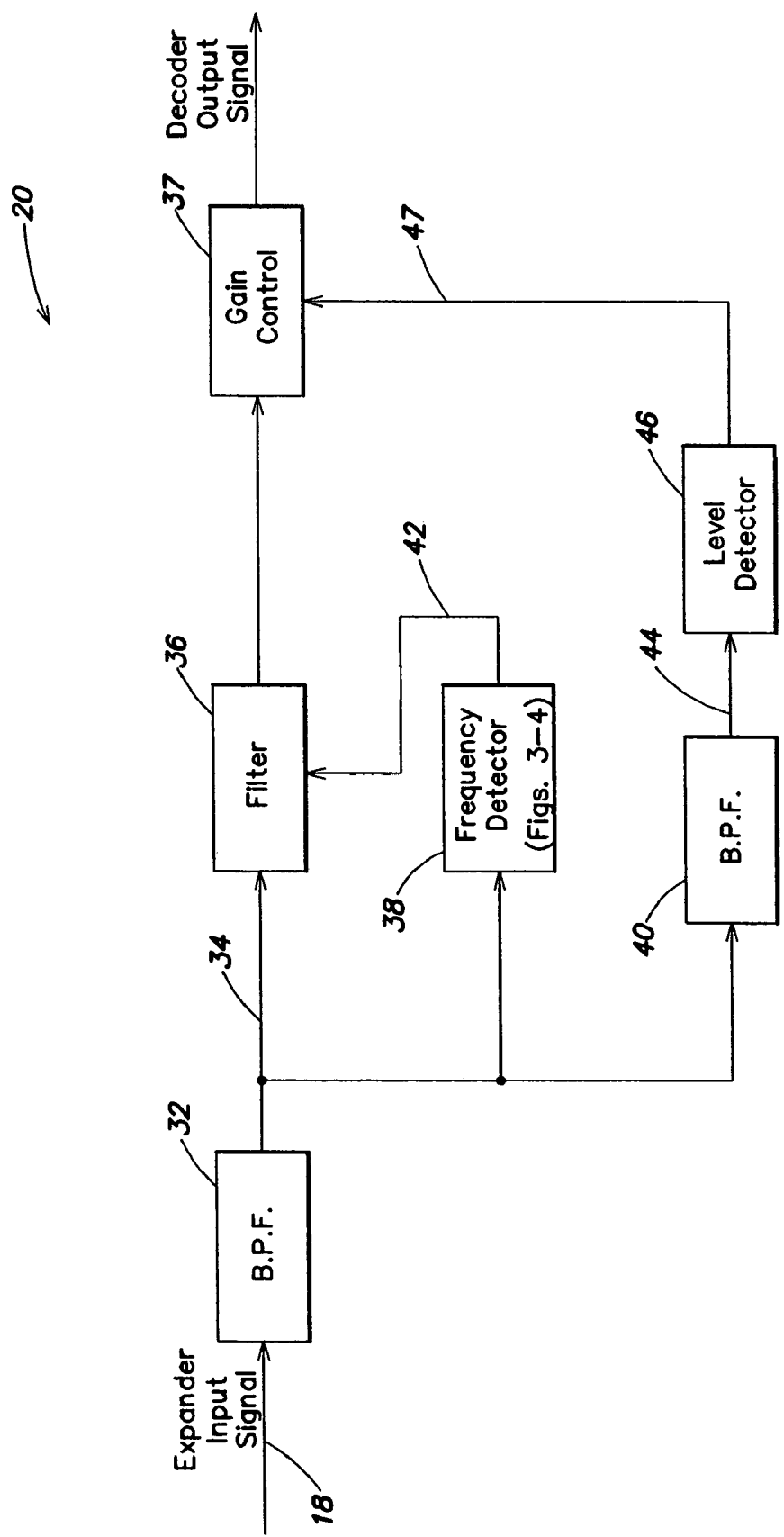
FIG. 2 is a block diagram illustration of the expander of the system illustrated in FIG. 1.

FIG. 2 is a block diagram illustration of the expander 20. The expander 20 includes a first bandpass filter (BPF) 32 that receives the compressed signal (e.g., a compressed audio signal) on the line 18. The bandpass filter 32 preferably includes a passband in the frequency range of about 20 Hz-20 kHz. The bandpass filter 32 provides a bandpass filtered signal on a line 34 to a variable filter 36, a frequency detector 38 and a second bandpass filter 40. The variable filter 36 receives a control signal on a line 42 that controls the gain impressed on the high frequency portion of the signal transmitted through the variable filter 36. The details of how this control signal is generated shall be discussed in detail hereinafter.

The second bandpass filter 40 includes a passband (e.g., 50 Hz to 5 kHz) that provides a second bandpassed signal on a line 44 to a level detector 46. The level detector 46 generates a gain control signal on a line 47 to the gain control 37, that provides a decoder output signal.

Figure 3:
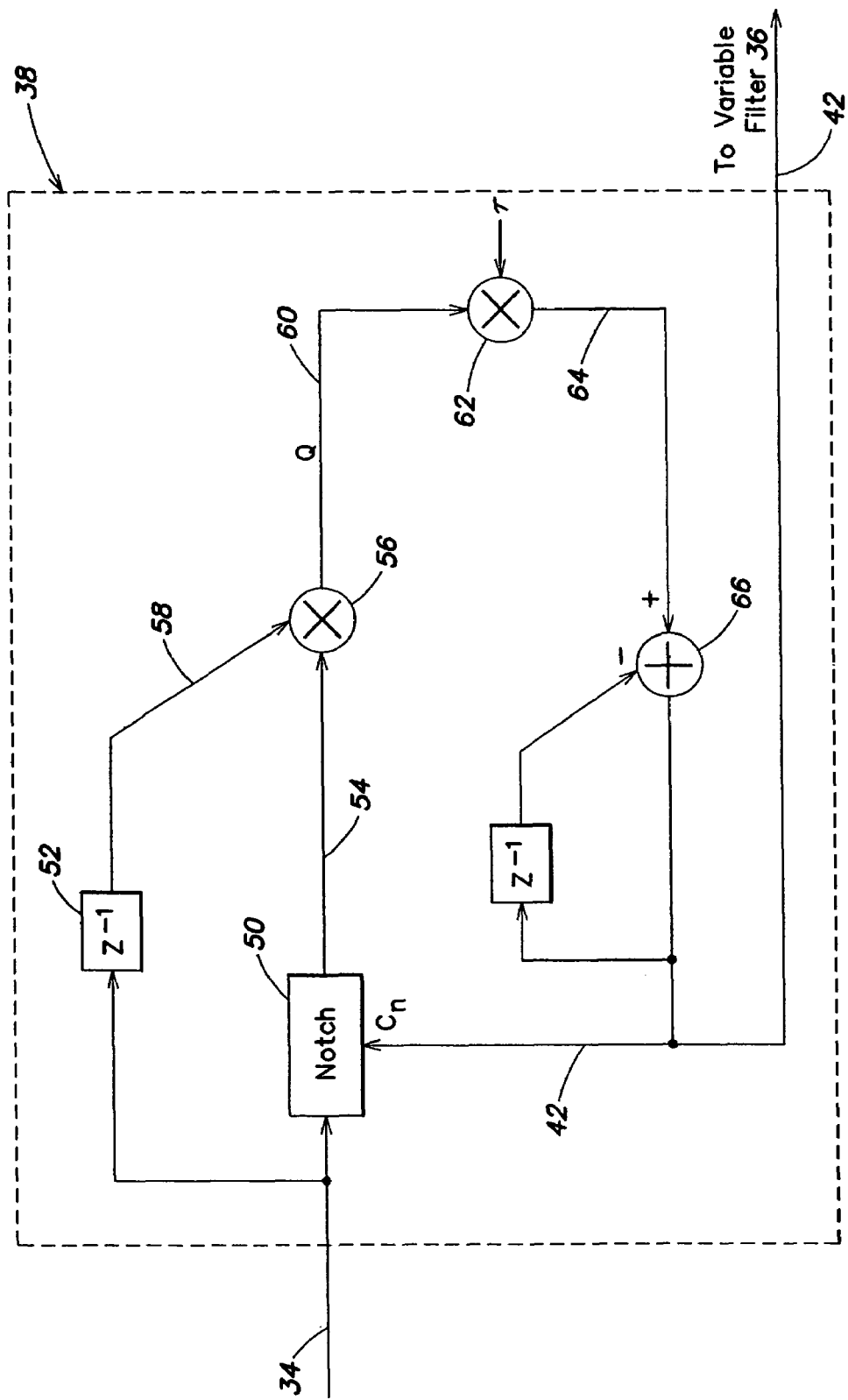
FIG. 3 is a block diagram illustration of the frequency detector of the expander.

According to an aspect of the present invention, the decoder 20 includes the frequency detector 38 that provides the control signal on the line 42. FIG. 3 is a block diagram illustration of the frequency detector 38. In this digital embodiment, the frequency detector 38 includes a notch filter 50 and a delay 52 that each receive the first bandpassed signal on the line 34. The notch filter 50 provides a notch filtered output signal on a line 54 to a mixer 56, which also receives, on a line 58, a delayed version of the input signal. The mixer 56 mixes the signals on the lines 54, 58 and provides a mixed signal on a line 60. A multiplier 62 multiplies the mixed signal on the line 60 with a time constant value τ, and the resultant product is provided on a line 64. A summer 66 then sums the past value of a control value $C_n$ with the signal value on the line 64. As a result, the control value $C_n$ on the line 42 can be expressed as:

$$C_n = C_{n-1} + (Q*\tau)$$ EQ. 1 where Q is equal to the signal on the line 60.

The control value $C_n$ is input to the notch filter 50 to control the location of the notch. For example, as the value of the control value $C_n$ increases, the frequency value of the notch increases. Similarly, as the control value $C_n$ decreases, the frequency value of the notch also decreases. Of course, one of ordinary skill will recognize the system may be configured such that the opposite is true.

Referring still to FIG. 3, the transfer function for the notch filter 50 may be expressed as:

$$1 + 2C_n z^{-1} + z^{-2}$$ EQ. 2

The mean frequency detector 38 operates to drive the control value $C_n$ to a value that causes the value of the signal on the line 60 to approach zero. For example, in steady state (i.e., the DC value of the signal on the line 60 is zero), the notch of the notch filter 50 is located at a frequency value such that approximately one-half of the energy of the signal on the line 34 is located less than the notch filter value, while the other half of the energy of the signal on the line 34 is located above the notch filter value.

Consider for example if the frequency spectrum of the input signal on the line 18 includes only frequency components of equal energy at 1 kHz and 3 kHz. In this case the mean frequency detector 38 would shift the notch of the notch filter 50 such that approximately one-half of the energy is above the notch while one-half the energy is below the notch (e.g., the notch is located at about 2 kHz). Once the mean frequency detector 38 reaches steady state in response to this input signal, the DC component of the signal on the line 60 will be zero and as a result the control signal value $C_n$ will be relatively constant.

Referring again to FIG. 1, the compressor 16 and the expander 20 are similar to those disclosed in U.S. Pat. No. 4,539,526, with the principal exception that the amount of preemphasis and deemphasis applied to the signal is determined by a novel frequency detection technique. Specifically, unlike the system disclosed in U.S. Pat. No. 4,539,526, the expander of the present invention utilizes the entire signal spectrum to determine the amount of deemphasis to be applied by the variable filter 36. The decoder disclosed in U.S. Pat. No. 4,539,526 looks at only the high frequency energy of the signal to determine the amount of deemphasis to be applied to the high frequency portion of the signal. In contrast, the expander/decoder of the present invention looks at entire signal spectrum to determine the frequency at which one-half of the input signal energy is below. A signal indicative of this frequency value is then used to determine the amount of deemphasis to be applied. Of course a complementary technique is used to compress the signal. In the interest of brevity elements that are substantially the same as those disclosed in U.S. Pat. No. 4,539,526 shall not be discussed herein. For example, the first and second BPFs 32, 40, the variable filter 36, the level detector 46 and the gain control 37 are similar to the corresponding elements disclosed in U.S. Pat. No. 4,539,526. Accordingly, U.S. Pat. No. 4,539,526 is hereby incorporated by reference.

Figure 4:
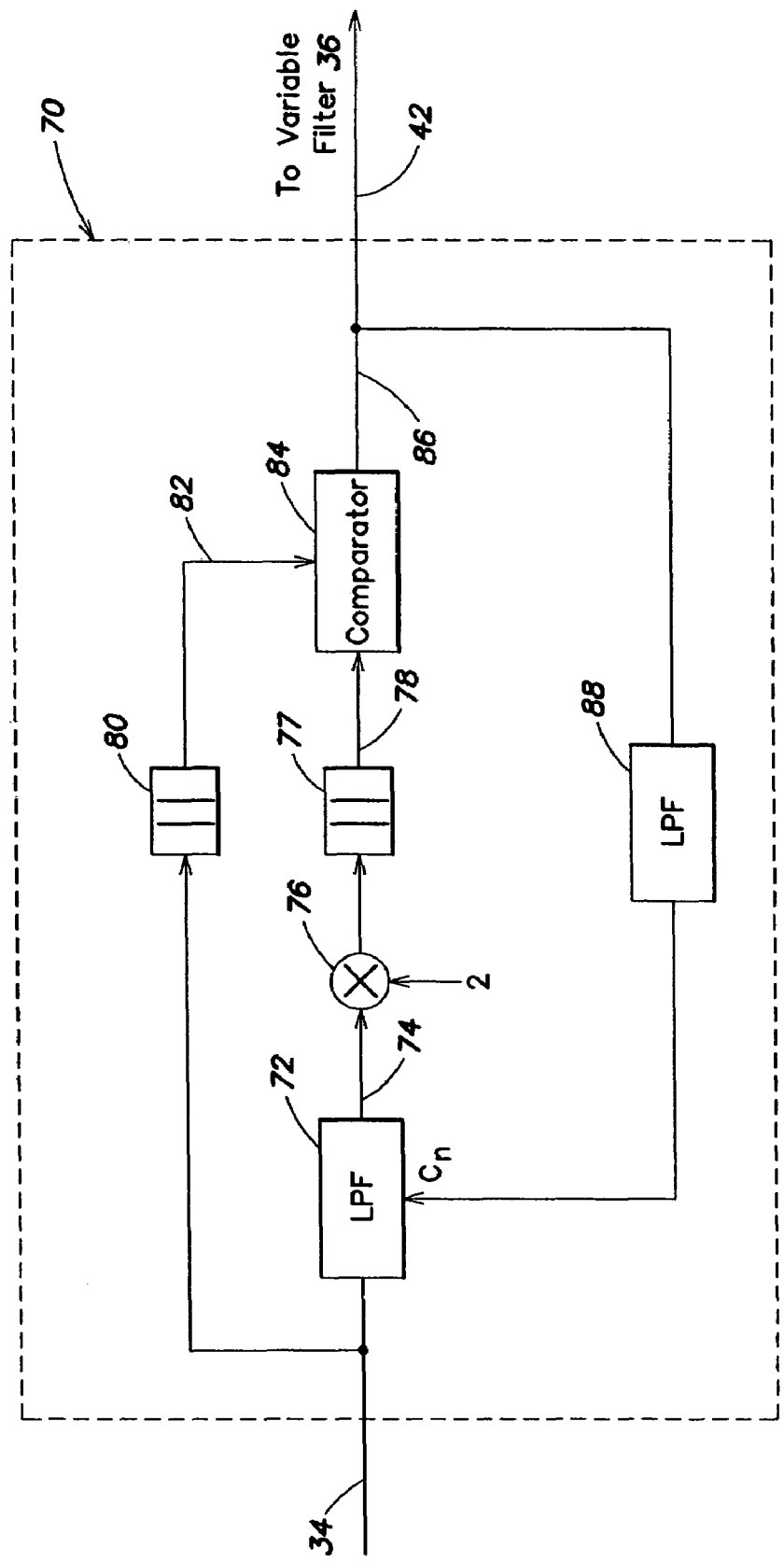
FIG. 4 is an alternative embodiment frequency detector.

FIG. 4 is an alternative embodiment mean frequency detector 70. This embodiment includes a variable low pass filter 72 having an adjustable corner frequency. This filter 72 provides a low pass filtered signal on a line 74 to a gain function 76 having a value of two and the resultant amplified signal is provided to a first absolute value unit 77 that provides a first absolute value signal on a line 78. A second absolute value unit 80 receives the input signal on the line 34, and provides a second absolute value signal on a line 82. A comparator 84 receives the first and second absolute value signals, and provides an output signal on a line 86 indicative of the difference between the signals. Specifically, if the value on the line 82 is greater than the value on the line 78, then the comparator 84 provides an output signal on the line 86 to increase the value of the corner frequency of the low pass filter 72. The signal on the line 86 may be input to a low pass filter 88 to smooth the signal prior to providing it to the low pass filter 72 to set the corner frequency thereof. Similarly, if the value on the line 82 is less than the value on the line 78, then the comparator 84 provides an output signal on the line 86 to decrease the value of the corner frequency of the low pass filter 72. In general, the value of the signal on the line 86 is driven such that the corner frequency of the low pass filter 72 is set to the one-half energy point of the signal on the line 34. That is, if the signal values on the lines 78 and 82 are equal, then the output value of the low pass filter 72 is one-half the value of the input signal on the line 34. As the input signal on the line 34 changes, the mean frequency detector 70 tracks the change to shift the corner frequency of the low pass filter 72 such that the value of the signals on the lines 78 and 82 are equal.

Figure 5:
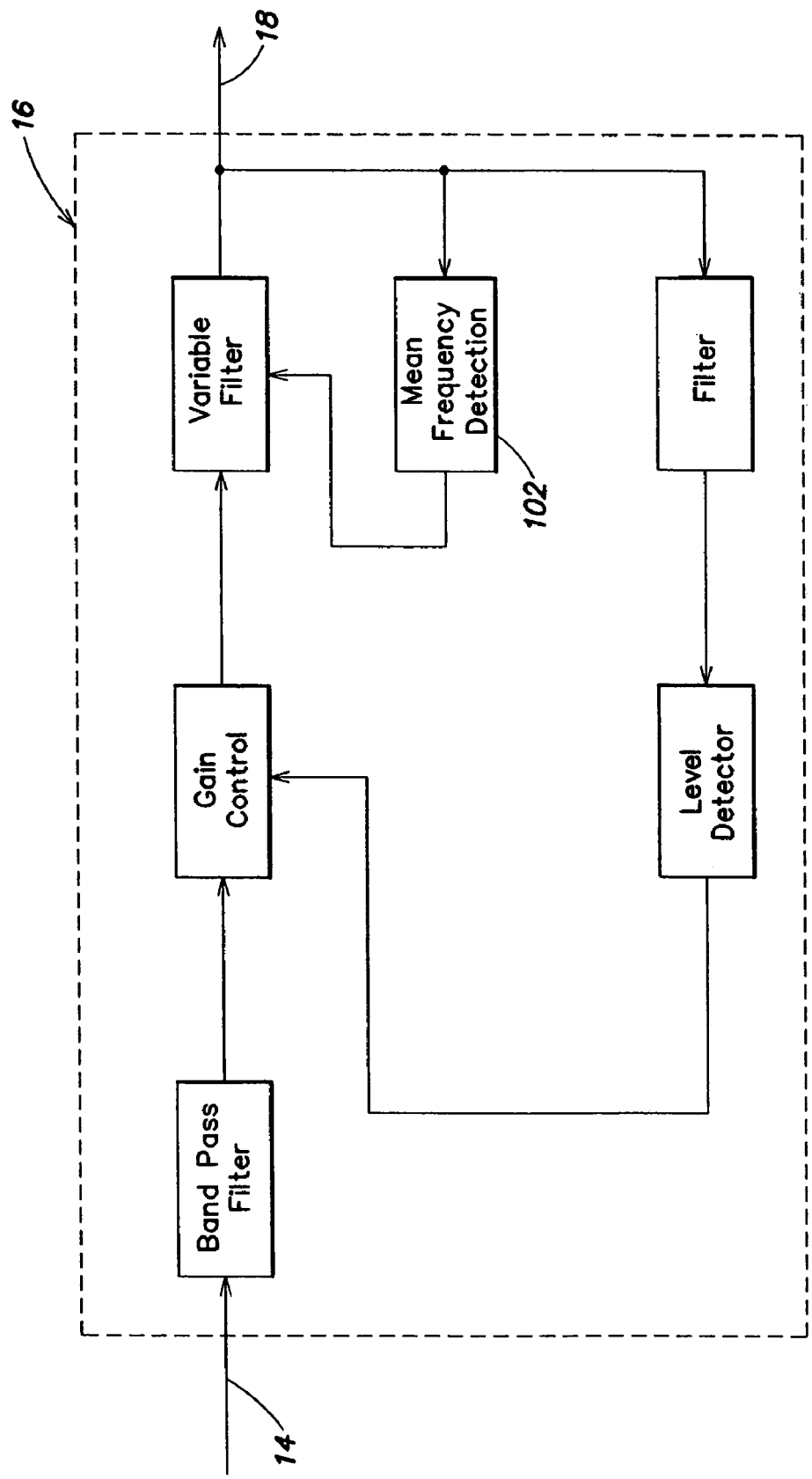
FIG. 5 is a block diagram illustration of the compressor of the system illustrated in FIG. 1.

FIG. 5 is a block diagram illustration of the compressor 16 of the system illustrated in FIG. 1. This compressor 16 is similar to the compressor disclosed in U.S. Pat. No. 4,539,526, with the principal exception that the amount of preemphasis applied to the signal is determined by a novel mean frequency detector 102, which is complementary to the mean frequency detector 38 (FIG. 2). Specifically, unlike the system disclosed in U.S. Pat. No. 4,539,526, the compressor of the present invention utilizes the entire signal spectrum to determine the amount of preemphasis. Again, in the interest of brevity elements that are substantially the same as those disclosed in U.S. Pat. No. 4,539,526 shall not be discussed at length herein.

Although the present invention has been shown and described with respect to several preferred embodiments thereof, various changes, omissions and additions to the form and detail thereof, may be made therein, without departing from the spirit and scope of the invention.

What is claimed is:

1. An adaptive signal weighting system including a signal path for transmitting an information signal of a predetermined bandwidth through said system, said system further comprising:

a filter that applies a first variable gain factor to said information signal within a first select spectral region of said predetermined bandwidth to provide a filtered signal, said first variable gain factor varying as a function of a first control signal;

means, responsive to said information signal, for generating said first control signal in accordance with a frequency value wherein a predetermined portion of the energy of said information signal is below said frequency value;

gain control means responsive to said filtered signal for varying signal gain impressed on said filtered signal substantially throughout said predetermined bandwidth by a second variable gain factor to provide an output signal, said second variable gain factor varying as a function of a second control signal; and means for generating said second control signal in response to and as a function of signal energy of said information signal substantially within a second select spectral region within said predetermined bandwidth.

2. A system according to claim 1 wherein said means for generating said second control signal comprises means for detecting the signal energy of said information signal below about 5 KHz.

3. A system according to claim 1, wherein said filter comprises means for varying the first variable gain factor impressed on said portion of said information signal so that said first variable gain factor varies from amplification for signals having relatively high energy within said second select spectral region to attenuation for signals having relatively low energy within said second select spectral region.

4. A system according to claim 1, wherein said filter comprises frequency discrimination means for detecting said portion of said information signal within said first select spectral region and for generating a frequency discrimination output signal representative of said portion, and second gain control means coupled to said frequency discrimination means for varying the gain impressed on said frequency discrimination output signal in response to and as a function of said first control signal.

5. A system according to claim 4, wherein said frequency discrimination means senses signal energy of said information signal above about 800 Hz.

6. A system according to claim 5, wherein said means for generating said first control signal comprises means for notch filtering and sensing the predetermined portion frequency value of said information signal.

7. A system according to claim 1, wherein said means for generating said first control signal comprises first detection means for detecting the frequency value wherein the predetermined portion of the signal energy of said information signal is below said frequency value.

8. A system according to claim 7, wherein said first detection means comprises a variable notch filter that receives and filters said information signal and provides a notch filtered signal value, wherein said notch filter includes a notch set as a function of said first control signal;

a mixer that receives and mixes said notch filtered signal value and a value indicative of said information signal, and provides a mixed signal indicative thereof; and an integrator, that integrates said mixed signal, to provide said first control signal.

9. A system according to claim 1, wherein said filter means comprises means for varying the first variable gain factor impressed on said portion of said information signal so that said first variable gain factor varies from attenuation for signals having relatively high energy levels within said second select spectral region to amplification of low energy signals having relatively low energy levels within said second select spectral region.

10. An adaptive signal weighting system including a signal path for transmitting an information signal of a predetermined bandwidth through said system, said system comprising:

a filter for applying a first variable gain factor to said information signal within a first select spectral region within said predetermined bandwidth to provide a filtered signal, said first variable gain factor varying as a function of a first control signal;

a frequency detection circuit that determines a frequency value wherein a selected percentage portion of the energy of said information signal is below said frequency value, and generates said first control signal in response to and in accordance with said frequency value wherein the selected percentage portion of the energy of said information signal is below said frequency value;

a gain circuit that receives said filter means for varying signal gain impressed on said information signal substantially throughout said predetermined bandwidth by a second variable gain factor to provide an output signal, said second variable gain factor varying as a function of a second control signal; and means for generating said second control signal in response to and as a function of signal energy of said information signal substantially within a second select spectral region within said predetermined bandwidth.

11. A system for decoding an encoded information signal of a predetermined bandwidth previously encoded so that said encoded information signal can be recorded on or transmitted through a dynamically-limited, frequency dependent channel having a dynamically-limited narrower portion in a first spectral region than in at least one other spectral region of said predetermined bandwidth, said system comprising:

input means for receiving said encoded information signal in its encoded form;

a signal transmission path coupled to said input means and responsive to said encoded information signal;

output means coupled to said signal transmission path for providing a decoded information signal;

gain control means disposed in said signal transmission path for varying a first signal gain impressed on said encoded information signal substantially throughout said predetermined bandwidth to provide a gain compensated signal, said first signal gain varying as a function of a first control signal;

a filter that generates a filtered information signal and that is disposed in said signal transmission path and coupled to said gain control means for impressing a second variable gain on a portion of said gain compensated signal substantially within said first spectral region so as to deemphasize said portion with respect to a remaining portion of said gain controlled information signal, said second variable gain varying as a function of a second control signal;

means for generating said first control signal in response to and as a function of signal energy within a second spectral region of said filtered information signal; and means for generating said second control signal in accordance with a frequency value wherein a selected percentage of the energy of said filtered information signal is below said frequency value.

12. A system according to claim 11, wherein said means for generating said second control signal comprises a variable notch filter that receives and filters said filtered information signal and provides a notch filtered signal value, wherein said notch filter includes a notch set as a function of said first control signal;

a mixer that receives and mixes said notch filtered signal value and a value indicative of said information signal, and provides a mixed signal indicative thereof; and an integrator, that integrates said mixed signal, to provide said second control signal.

13. A system according to claim 11, wherein said means for generating said second control signal comprises a low pass filter that filters said filtered information signal to provide a first filtered signal;

an amplifier that receives and amplifies said first filtered signal and provides a first amplified signal;

a first absolute value detector that receives said first filtered signal and provides a first absolute filtered signal indicative thereof;

a second absolute value detector that receives said filtered information signal and provides a second absolute signal indicative thereof;

a comparator that compares said first absolute signal and said second absolute signal and provides a control signal; and means, responsive to said control signal, for generating said second control signal.

14. A system according to claim 11, wherein said means for generating said first control signal comprises first detection means for detecting said signal energy of said filtered information signal within said second spectral region that includes the selected percentage of the energy of said filtered information signal.

15. A system according to claim 14, wherein said first detection means comprises means for generating a D.C. signal as a function of detected signal energy.

16. A system according to claim 15, wherein said means for generating a D.C. signal comprises a root mean square (RMS) detector.

17. A system according to claim 16, wherein said first control means comprises a voltage control amplifier.

18. A system according to claim 17, wherein said amplifiers are set for signal expansion at substantially the same expansion ratio.

19. A system according to claim 18, wherein said expansion ratio is 1:2.

* * * * *